US007230429B1

(12) United States Patent
Huang et al.

(10) Patent No.: US 7,230,429 B1
(45) Date of Patent: Jun. 12, 2007

(54) METHOD FOR APPLYING AN IN-PAINTING TECHNIQUE TO CORRECT IMAGES IN PARALLEL IMAGING

(75) Inventors: Feng Huang, Gainesville, FL (US); G. Randy Duensing, Gainesville, FL (US); Yunmei Chen, Gainesville, FL (US)

(73) Assignee: Invivo Corporation, Gainesville, FL (US)

( * ) Notice: Subject to any disclaimer, the term of this patent is extended or adjusted under 35 U.S.C. 154(b) by 320 days.

(21) Appl. No.: 11/041,904

(22) Filed: Jan. 24, 2005

Related U.S. Application Data

(60) Provisional application No. 60/538,504, filed on Jan. 23, 2004.

(51) Int. Cl.
*G01V 3/00* (2006.01)

(52) U.S. Cl. ...................................... 324/322; 324/318
(58) Field of Classification Search ................ 324/322, 324/319, 318, 309, 300; 600/410, 422
See application file for complete search history.

(56) References Cited

U.S. PATENT DOCUMENTS

| 6,937,015 B2* | 8/2005 | Heid ........................... 324/307 |
| 2004/0000906 A1 | 1/2004 | King | |
| 2004/0000908 A1* | 1/2004 | Molyneaux et al. ........ 324/318 |
| 2004/0070395 A1* | 4/2004 | Ogino ......................... 324/307 |

OTHER PUBLICATIONS

Lin, F. et al. "Estimation of coil sensitivity map and correction of surface coil magnetic resonance images using wavelet decomposition." *Proc. Intl. Soc. Mag. Reson. Med.*, 2001, p. 801, vol. 9.

Rudin, L. et al. "Nonlinear total variation based noise removal algorithms." *Physica D*, 1992, pp. 259-268, vol. 60.
Aubert, G. et al. "A Variational Method in Image Recovery" *Siam J. Numer. Anal.*, Oct. 1997, pp. 1948-1979 vol. 34, No. 5.
Ballester, C. et al. "Filling-In by Joint Interpolation of Vector Fields and Gray Levels" *IEEE Transactions on Image Processing*, Aug. 2001, pp. 1200-1211, vol. 10, No. 8.
Ballester, M. A. G. et al. "Robust Estimation of Coil Sensitivities for RF Subencoding Acquisition Techniques" *Proc. Intl. Soc. Mag. Reson. Med.*, 2001, p. 799, vol. 9.
Bertalmio, M. et al. "Image Inpainting", conference paper presented at Computer Graphics, SIGGRAPH, 2000.
Caselles, V. et al. "An Axiomatic Approach to Image Interpolation" *IEEE Transactions on Image Processing*, Mar. 1998, pp. 376-386, vol. 7, No. 3.
Chan, T.F. et al. "Euler's Elastica and Curvature-Based Inpainting" *Siam J. Appl. Math.*, 2002, pp. 564-592, vol. 63, No. 2.

(Continued)

*Primary Examiner*—Brij B. Shrivastav
(74) *Attorney, Agent, or Firm*—Saliwanchik, Lloyd & Saliwanchik

(57) ABSTRACT

The subject invention pertains to a method and apparatus for producing sensitivity maps with respect to medical imaging. The subject invention relates to a method for applying an inpainting model to correct images in parallel imaging. Some images, such as coil sensitivity maps and intensity correction maps, have no signal at some places and may have noise. Advantageously, the subject invention allows an accurate method to fill in holes in sensitivity maps, where holes can arise when, for example, the pixel intensity magnitudes for two images being used to create the sensitivity map are zero. A specific embodiment of the subject invention can accomplish de-noise, interpolation, and extrapolation simultaneously for these types of maps such that the local texture can be carefully protected.

1 Claim, 3 Drawing Sheets

OTHER PUBLICATIONS

Chan, T. et al. "Mathematical Models for Local Nontexture Inpaintings", *SIAM J. Appl. Math.*, 2002, pp. 1019-1043, vol. 62, No. 3.

Chan, T. F. et al. "Nontexture Inpainting by Curvature-Driven Diffusion" *Journal of Visual Communication and Image Representation*, 2001, pp. 436-449, vol. 12, No. 4.

Chan, T. F. et al. "Variational PDE Models in image processing" *Amer Math Soc Notice*, 2003, pp. 14-26, vol. 50.

Cohen, M. S. et al. "Rapid and Effective Correction of RF Inhomogeneity for High Field Magnetic Resonance Imaging" *Human Brain Mapping*, 2000, pp. 204-211, vol. 10.

Esedoglu, S. et al. "Digital Inpainting Based on the Mumford-Shah-Euler Image Model" *European J. Appl. Math*, 2002, pp. 353-370, vol. 13.

Lin, F. et al. "Removing Signal Intensity Inhomogeneity from Surface Coil MRI Using Discrete Wavelet Transform and Wavelet Packet", 23rd Annual International Conference of the IEEE, Engineering in Medicine and Biology Society, 2001.

Pruessmann, K. P. et al. "SENSE: Sensitivity Encoding for Fast MRI" *Magnetic Resonance in Medicine*, 1999, pp. 952-962, vol. 42.

\* cited by examiner

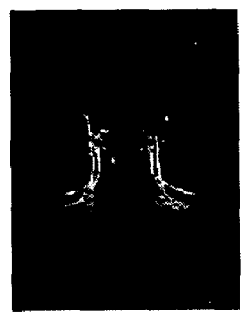
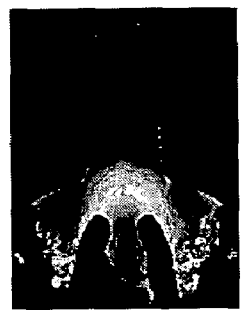
FIG. 3A                FIG. 3B
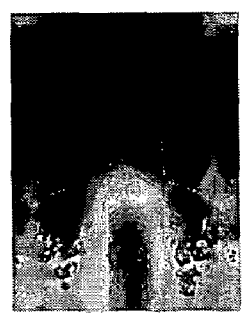
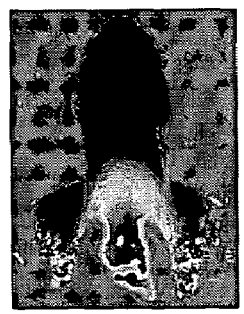
FIG. 3C                FIG. 3D
FIG. 3E                FIG. 3F
FIG. 3G                FIG. 3H

METHOD FOR APPLYING AN IN-PAINTING TECHNIQUE TO CORRECT IMAGES IN PARALLEL IMAGING

CROSS-REFERENCE TO RELATED APPLICATION(S)

The subject application claims benefit of U.S. Provisional Patent Application Ser. No. 60/538,504, filed Jan. 23, 2004, which is hereby incorporated by reference herein in its entirety, including any figures, tables, or drawings.

FIELD OF THE INVENTION

The present invention relates generally to the field of medical imaging. More particularly, the invention relates to magnetic resonance imaging and to the production of sensitivity maps.

BACKGROUND OF THE INVENTION

Techniques for map correction in the parallel imaging field have been used, such as the polynomial fit procedure (Pruessmann K P W M, Scheidegger M B, Boesiger P. SENSE: Sensivity encoding for fast MRI. *Magn Reson Med* 1999; 42: 952-962), thin-plate splines (Miguel Angel Gonzalez Ballester Y M, Yoshimori Kassai, Yoshinori Hamamura, Hiroshi Sugimoto, *Robust Estimation of Coil Sensitivities for RF Subencoding Acquisition Techniques.* 2001. p 799), wavelets (F. H. Lin Y-JC, and J. W. Belliveau, L. L. Wald, *Estimation of coil sensitivity map and correction of surface coil magnetic resonance images using wavelet decomposition.* 2001; Brighton, UK), and Gaussian kernel smoothing (M. S. Cohen R M D, and M. M. Zeineh. Rapid and effective correction of RF inhomogeneity for high field magnetic resonance imaging. *Hum Brain Mapp* 2000; 10: 204-211). There are references that disclose inpainting techniques (G. Aubert L V. A variational method in image recovery. *SIAM J Numer Anal* 1997; 34(5): 1948-1979; Shen TFCaJ. Non-texture inpainting by curvature driven diffusions. *J Visual Comm Image Rep* 2001; 12(4): 436-449; Tony F Chan J S, Luminita Vese. Variational PDE models in image processing. *Amer Math Soc Notice* 2003; 50: 14-26; Tony F Chan J S. Mathematical model for local non-texture inpaintings. *SIAM J Appl Math* 2001; 62(3): 1019-1043; V. Caselles J-MM, and C. Sbert. An axiomatic approach to image interpolation. *IEEE Trans Image Processing* 1998; 7(3): 376-386). There are also references that teach sensitivity map correction (Pruessmann K P W M, Scheidegger M B, Boesiger P. SENSE: Sensitivity encoding for fast MRI. *Magn Reson Med* 1999; 42:952-962; Miguel Angel Gonzalez Ballester Y M, Yoshinori Kassai, Yoshinori Hamamura, Hiroshi Sugimoto. *Robust Estimation of Coil Sensitivities for RF Subencoding Acquisition Techniques.* 2001, p. 799; F.-H. Lin Y-JC, and J. W. Belliveau, L. L. Wald. *Estimation of coil sensitivity map and correction of surface coil magnetic resonance images using wavelet decomposition.* 2001; Brighton, UK.; M. S. Cohen RMD, and M. M. Zeineh. Rapid and effective correction of RF inhomogeneity for high field magnetic resonance imaging. *Hum Brain Mapp* 2000; 10:204-211, U.S. Published Application No. U.S. 2004/0000906 A1, King et al., published Jan. 1, 2004). However, these existing techniques for use in parallel imaging do not protect the local texture.

The existing methods referred to are based on the assumption that the map is sufficiently smooth (i.e., contains no sharp variations). However, the map that needs correction is typically piece-wise smooth. Hence, the map corrected by these methods is often over-smoothed and the local texture is often destroyed.

Image inpainting was originally an artistic phrase referring to an artist's restoration of a picture's missing pieces. Computer techniques could significantly reduce the time and effort required for fixing digital images, not only to fill in blank regions but also to correct for noise. Digital inpainting techniques (C. Ballester M B, V. Caselles, G. Sapiro, and J. Verdera. Filling-in by joint interpolation of vector fields and grey levels. *IEEE Trans Image Process* 2001; 10(8): 1200-1211; Tony F Chan J S, Luminita Vese. Variational PDE models in image processing. *Amer Math Soc Notice* 2003; 50:14-26; Tony F Chan J S. Mathematical model for local non-texture inpaintings. *SIAM J Appl Math* 2001; 62(3): 1019-1043; Shen TFCaJ. Non-texture inpainting by curvature driven diffusions. *J Visual Comm Image Rep* 2001; 12(4): 436-449; V. Caselles J-MM, and C. Sbert. An axiomatic approach to image interpolation. *IEEE Trans Image Processing* 1998; 7(3): 376-386) are finding broad applications such as, image restoration, dis-occlusion, perceptual image coding, zooming and image super-resolution, and error concealment in wireless image transmission. Due to its broad range of applications, various methods for inpainting have been developed, ranging from nonlinear filtering methods, wavelets and spectral methods, and statistical methods (especially for textures). The most recent approach to non-texture inpainting is based on the PDE method and the Calculus of Variations. According to Chan and Shen (Tony F Chan J S, Luminita Vese. Variational PDE models in image processing. *Amer Math Soc Notice* 2003; 50: 14-26) PDE based TV models and the Mumford-Shah model work very well for inpainting problems with a more local nature such as hole filling (holes being regions of low signal in magnetic resonance (MR) images). Hole filling is an important issue in the correction of MR sensitivity maps, which are generally derived from MR images.

In magnetic resonance imaging (MRI) systems, sensitivity maps are meant to contain the sensitivity information of radio frequency (RF) probe coils. Highly accurate knowledge of the spatial receiver sensitivity is required by both SMASH (Simultaneous Acquisition of Spatial Harmonics (Sodickson D. *Spatial Encoding Using Multiple RF Coils: SMASH Imaging and Parallel MRI.* I Y, editor: John Wiley & Sons Ltd; 2000.)) and SENSE (Sensitivity Encoding (Pruessmann K P W M, Scheidegger M B, Boesiger P. Coil sensitivity encoding for fast MRI. 1998; *Sixth Scientific Meeting of ISMRM,* Sydney, Australia. P. 579.; Pruessmann K P W M, Scheidegger M B, Boesiger P. SENSE: Sensitivity encoding for fast *MRI. Magn Reson Med* 1999; 42: 952-962.)). Sensitivity maps are also important to correcting the inhomogeneities of MRI surface coils. Accurate sensitivity information can only be obtained where signal is present. However, some data sets have large areas contributing little or no signal. Such dark regions (i.e. holes) are common, for example, in pulmonary MRI using Fresh Blood Imaging (FBI). In this case, sensitivity map interpolation techniques are often used to fix the holes. To deal with slightly varying tissue configurations and motion, extrapolation over a limited range can be utilized. Therefore, there is a need for technique that is capable of simultaneously interpolating and extrapolating. There are some existing techniques for this purpose, such as the polynomial fit procedure (Sodickson D. Spatial Encoding Using Multiple RF Coils: SMASH Imaging and Parallel MRI. I Y, editor: John Wiley & Sons Ltd; 2000.), thin-plate splines (Miguel Angel Gonzalez Ballester Y M, Yoshimori Kassai, Yoshinori Hamamura, Hiroshi Sugimoto, *Robust Estimation of Coil Sensitivities for RF Subencoding Acquisition Techniques.* 2001. p 799.), wavelets (F. H. Lin Y-JC, and J. W. Belliveau, L. L. Wald. *Estimation of coil sensitivity map and correction of surface coil magnetic resonance images using wavelet decomposition.* 2001; Brighton, U K.), and Gaussian kernel smoothing (M. S. Cohen RMD, and M. M. Zeineh. Rapid and effective correction of RF inhomogeneity for high field magnetic resonance imaging. *Hum Brain Mapp* 2000; 10: 204-2). These methods are based on the assumption that the sensitivity map is sufficiently smooth (i.e., containing no sharp variations). However, this assumption is not always true. If the sensitivity map is piecewise smooth, which is usually true for non-uniform loading, the existing methods are not sufficient. Accordingly, there is a need for an inpainting model that can apply a technique to handle interpolation and extrapolation for piecewise smooth maps simultaneously.

BRIEF SUMMARY OF THE INVENTION

The subject invention pertains to a method and apparatus for producing sensitivity maps with respect to medical imaging. In a specific embodiment, the subject invention can be useful in magnetic resonance imaging. In another specific embodiment, the subject invention applies an inpainting technique to producing sensitivity maps in medical imaging application. The subject invention relates to a method for applying an inpainting model to correct images in parallel imaging. Some images, such as coil sensitivity maps and intensity correction maps, have no signal at some places and may have noise. Advantageously, the subject invention allows an accurate method to fill in holes in sensitivity maps, where holes can arise when, for example, the pixel intensity magnitudes for two images being used to create the sensitivity map are zero. A specific embodiment of the subject invention can accomplish de-noise, interpolation, and extrapolation simultaneously for these types of maps such that the local texture can be carefully protected.

The subject invention can allow the application of map correction methods that can protect local texture on a parallel imaging field. One example of an inpainting technique that can be utilized to produce sensitivity maps in accordance with the subject invention is Total Variation (TV) inpainting. Other inpainting algorithms can also be used to produce sensitivity maps in accordance with the subject invention. Examples of other inpainting techniques which can be utilized in accordance with the subject invention include, but are not limited to the following:

[1] A partial differential equation (PDE) based inpainting: transportation. This method is based on propagation of information. The following is an equation for evolution.

$$\frac{\partial I}{\partial t} = \nabla(\ddot{A}I) \cdot \nabla^\perp I$$

[2] Jointly continue/interpolate level-lines(geometry)and gray values (photometry) in a smooth fashion. The function is $$\min(u, \grave{e}) \int_{\Omega \cup Band} div(\grave{e})^p (a + b\|\nabla G * u\|) + c(\|\nabla u\| - \grave{e} \cdot \nabla u)$$

[3] A PDE base inpainting: CDD (curvature driven diffusions). This method was introduced by Chan and Shen in 2000. Information is "fluxed into" the inpainting domain by diffusions. Using 'Bad' Curvatures to Drive Interpolation $$\frac{\partial}{\partial t} u = \nabla \cdot \left[ \frac{g(\kappa)}{|\nabla u|} \nabla u \right].$$

where, g in the diffusivity coeff is to penalize large curvature.

[4] Bayesian framework for image restoration: meaning the Best GUESS. Chan, Kang and Shen (2001) Gibbs Fields & Ising's Lattice Spins $$u^0|_{\Omega \backslash D} = [K * u_{original} \oplus noise]_{\Omega \backslash D}.$$

$$E[u^0 \mid u] = \frac{\lambda}{2} \int_{\Omega \backslash D} (K * u - u^0)^2 \, dx.$$

[5] TV(Total Variation)inpainting [T. F. Chan and J. Shen, "Mathematical models for local non-texture inpaintings," *SIAM J. Appl Math*, vol. 62, pp. 1019-1043, 2001.] Space of BV and Connection to Minimal Surfaces $$E[u|u^0,D] = \tfrac{1}{2} \int_\Omega \lambda_D(x)(u-u^0)^2 dx + \alpha \int_\Omega |\nabla u| dx$$

[6] Elastica Inpainting[T. Chan, S.-H. Kang, and J. Shen, "Euler's elastica and curvature based inpainting," *SIAM J Appl Math,* 2002] From Euler to Mumford, Curves to Images.

$$E[u \mid u^0, D] = \int_\Omega \varphi(\kappa)|\nabla u| \, dx + \frac{\lambda}{2} \int_{\Omega \backslash D} |u - u^0|^2 \, dx,$$

$$\kappa = \nabla \cdot \vec{n} \text{ is the curvature, } \varphi(\kappa) = a + b\kappa^2.$$

[7] Mumford-Shah-Euler Inpainting[S. Esedoglu and J. Shen, "Digital inpainting based on the Mumford-Shah-Euler image model," *European J. Appl. Math*, vol. 13, pp. 353-370, 2002]: Free Boundary, G-Convergence $$E_{mse}[u, \Gamma] = \frac{\gamma}{2} \int_{\Omega \backslash \Gamma} |\nabla u|^2 \, dx + e(\Gamma);$$

$$e(\Gamma) = \alpha \text{ length } (\Gamma) + \beta \int_\Gamma \kappa^2 \, ds, \text{ the elastica energy.}$$

And The G-convergence approximation (conjecture) of De Giorgi (1991)

$$E_\varepsilon[u, z] = \frac{\gamma}{2} \int_\Omega (z^2 + o(\varepsilon))|\nabla u|^2 \, dx +$$

$$\alpha \int_\Omega \left( \varepsilon |\nabla z|^2 + \frac{W(z)}{4\varepsilon} \right) dx + \frac{\beta}{\varepsilon} \int_\Omega \left( 2\varepsilon \nabla z - \frac{W'(z)}{4\varepsilon} \right)^2 dx,$$

$$W(z) = (1-z)^2(1+z)^2 \text{ is the double-well potential.}$$

In specific embodiment, the traditional Total Variation inpainting model can be modified to automatically protect the local texture through changing the power of $|\nabla_u|$ in the smooth term from a constant to a function. For the application of the subject technique to sensitivity maps, the inpainting model is modified to include the property that with respect to the sensitivity map, the sum of squares of the sensitivity map of each coil equals one.

The subject invention also relates to the application of other inpainting techniques, such as a Mumford-Shah based model to parallel imaging where some modifications are made to the existing inpainting technique. The subject invention also pertains to the application of one or more wavelet based interpolation methods to parallel imaging.

Low-resolution raw sensitivity maps are often applied clinically. The subject invention can improve the accuracy of a sensitivity map without much time consumption, and consequently increase the reduce factor of K-space to improve the efficiency.

BRIEF DESCRIPTION OF THE DRAWINGS

FIG. 1A shows a photo of the phantom, FIG. 1B shows the magnitude of the reference sensitivity map, FIG. 1C shows the magnitude of the sensitivity map with 5 randomly chosen holes, FIG. 1D shows the magnitude of the inpainted sensitivity map produced in accordance with the subject method.

FIG. 2A shows a reference Image, FIG. 2B shows the magnitude of the raw sensitivity, FIG. 2C shows the magnitude of the inpainted sensitivity map, FIG. 2D shows the magnitude of the sensitivity map by Gaussian kernel smooth, FIG. 2E shows the intensity difference by using a high resolution inpainted sensitivity map, FIG. 2F shows the intensity difference by using a raw high resolution inpainted sensitivity map, FIG. 2G shows the intensity difference by using a high resolution Gaussian Kernel smoothed sensitivity map, and FIG. 2H shows the intensity difference by using low resolution inpainted sensitivity map, where FIGS. 2E to 2H use the same gray scale map.

FIGS. 3A-3H show results in accordance with the subject invention for neurovascular images, where FIG. 3A shows a reference image, FIG. 3B shows the magnitude of the raw sensitivity, FIG. 3C shows the magnitude of the inpainted sensitivity map, FIG. 3D shows the magnitude of the sensitivity map by Gaussian kernel smooth, FIG. 3E shows the intensity difference by using a high resolution inpainted sensitivity map, FIG. 3F shows the intensity difference by using a raw high resolution inpainted sensitivity map, FIG. 3G shows the intensity difference by using a high resolution Gaussian Kernel smoothed sensitivity map, and FIG. 3H shows the intensity difference by using a low resolution inpainted sensitivity map, where FIGS. 3E-3H use the same gray scale map.

DETAILED DISCLOSURE OF THE INVENTION

Figure 1A:
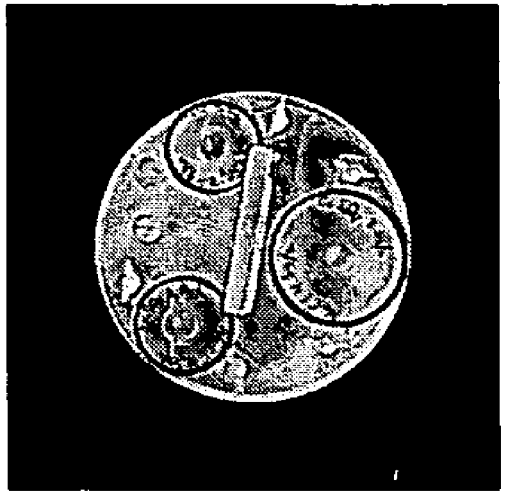
FIGS. 1A-1D show results in accordance with the subject invention for a phantom, where the maps shown in FIGS. 1B-1D are for coil 1.
Figure 1B:
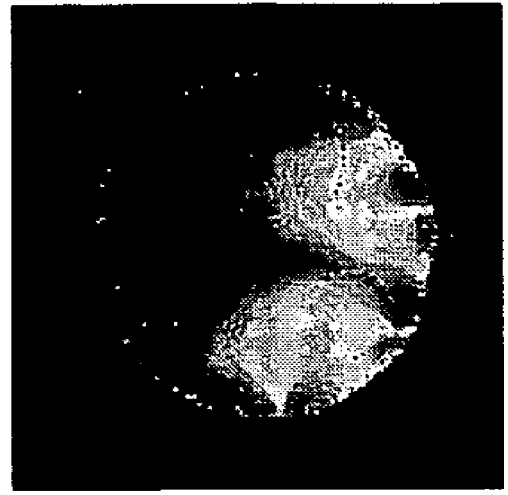

The subject invention pertains to a method and apparatus for producing sensitivity maps with respect to medical imaging. In a specific embodiment, the subject invention can be useful in magnetic resonance imaging. In another specific embodiment, the subject invention applies an inpainting technique to producing sensitivity maps in medical imaging application. The subject invention relates to a method for applying an inpainting model to correct images in parallel imaging. Some images, such as coil sensitivity maps and intensity correction maps, have no signal at some places and may have noise. Advantageously, the subject invention allows an accurate method to fill in holes in sensitivity maps, where holes can arise when, for example, the pixel intensity magnitudes for two images being used to create the sensitivity map are zero. A specific embodiment of the subject invention can accomplish de-noise, interpolation, and extrapolation simultaneously for these types of maps such that the local texture can be carefully protected.

The subject invention can allow the application of map correction methods that can protect local texture on a parallel imaging field. One example of an inpainting technique that can be utilized to produce sensitivity maps in accordance with the subject invention is Total Variation (TV) inpainting. Other inpainting algorithms can also be used to produce sensitivity maps in accordance with the subject invention.

The subject invention also pertains to applying an inpainting model to sensitivity maps. The subject method can address one or more, and preferably all, of the major issues involved in the correction of sensitivity maps. Advantageously, these issues can be addressed effectively and simultaneously. The subject method can also accomplish de-noising. The subject method can allow fixing of holes in an image and the smooth extension of the original map to the entire image. The subject invention can enable inpainted sensitivity maps to produce better results than both raw sensitivity maps and GKS sensitivity maps.

In a specific embodiment, the ghost ratios of the results obtained by using inpainted sensitivity maps are only 23% to 61% of the ghost ratios obtained by the use of raw sensitivity maps, and 48% to 94% of the ghost ratios obtained from using GKS sensitivity maps. In contrast with the suggestion that the "sum-of-squares" is applicable only if the object phase is sufficiently smooth so as to ensure that the corrected maps will be largely unaltered, (Pruessmann K P W M, Scheidegger M B, Boesiger P. SENSE: Sensivity encoding for fast MRI. *Magn Reson Med* 1999; 42: 952-962). With the application of the subject model this restriction becomes unnecessary since isotropic and anisotropic diffusion are effectively combined in the subject method. The subject inpainting technique is fast. In a specific embodiment, the average process time for a 256×256 image is less than 2 seconds. The subject model functions well for a variety of image types, including, but not limited to, phantom, neurovascular, and cardiac, and for both the high-resolution and low-resolution methods of generating sensitivity maps.

For purposes of describing the subject invention, several terms will be discussed. The process by which holes are fixed using inpainting is referred to as diffusion. There are two basic types of diffusion, isotropic and anisotropic. In isotropic diffusion, pixels in hole regions are fixed by assigning them a value equal to the isotropically weighted average value of their surrounding neighbors. Isotropically, as used in this instance, meaning the weights will be independent of direction from the pixel. In isotropic diffusion, the weights decrease with distance of the neighbor pixel from the pixel. Anisotropic diffusion involves assigning these pixels values obtained by extending the intensity contours from non-hole regions into hole regions along the intensity level set. The "intensity level set" being simply the contour lines of equal intensity in an image, i.e., the set of equi-intensity curves. Intensity here refers only to the magnitude of the complex pixel values.

Review of the TV Inpainting Model

If the inpainting problem is treated as an input-output system, then the input is the image $u^0$ which needs inpainting along with the specification of the hole regions (dark regions), D, in the image. The output is a de-noised image u without any holes.

The hole-free part of the image, where inpainting is not needed, is not supposed to be changed much. Mathematically we wish to keep u and $u^0$ as close as possible on the parts of the image not contained in D. For this purpose we define, Ω: the image domain Ω\D: the area where the image information is contained, which is referred to as "known locations."

Let us define, $$\lambda_D(x) = \begin{cases} 0, & x \in D \\ 1, & x \in \Omega \backslash D \end{cases} \quad (1)$$

Then the desired similarity of u and $u^0$ at "known locations" can be achieved through minimizing the term, $\int_\Omega \lambda_D(x)(u-u^0)^2 dx$. This term is called the fidelity term.

To reconstruct the missing parts without losing local image texture (i.e., near the holes), it is preferable that the image model smoothly extends the image into the holes and preserves the edges of objects contained in the image. This can be achieved through minimizing (Tony F Chan J S. Mathematical model for local non-texture inpaintings. *SIAM J Appl Math* 2001; 62(3): 1019-1043.; L. Rudin S O, and E. Fatemi. Nonlinear total variation based noise removal algorithms. *Physica D* 1992; 60: 259-268.)

$$\int_\Omega |\nabla u| dx \quad (2)$$

This term is used to smooth and extend the image along the intensity level set, hence this term is called the smoothing term.

The conventional TV model combines these two terms and is given as, $$E[u|u^0,D]=\tfrac{1}{2}\int_\Omega \lambda_D(x)(u-u^0)^2 dx + \alpha \int_\Omega |\nabla u| dx \quad (3)$$

where α is a parameter used to balance the smoothing and fidelity terms. Given $u^0$ and D, the u which minimizes the energy functional will be the inpainting result.

Modification of the exponent of $|\nabla u|$ in the TV model

The main feature of the conventional TV model is its ability to preserve edges given the fact that the anisotropic diffusion is always perpendicular to ∇u (L. Rudin S O, and E. Fatemi. Nonlinear total variation based noise removal algorithms. *Physica D* 1992; 60: 259-268.). Minimizing $\int_{106} |\nabla u| dx$ makes sure that the smoothing is along the level set and therefore preserves and enhances edges. However, there are limitations that arise when reconstructing piecewise smooth images or those in which the noise and the edges are extremely difficult to distinguish, which is often true for sensitivity maps. In smooth regions, isotropic diffusion is appropriate to remove noises. If the traditional TV model is applied onto a region where noise and edges are difficult to distinguish, then anisotropic diffusion is applied and the noise is kept. Because the exponent of $|\nabla u|$ determines the type of diffusion (isotropic or anisotropic), this naturally leads to models in which the exponent of $|\nabla u|$ is a function P(X). More specifically, one might want to consider $P=P(|\nabla u|)$ where, $$\lim_{y \to 0} p(y) = 2 \text{ and } \lim_{y \to \infty} p(y) = 1.$$

Therefore we may wish to minimize $$\int_{106} |\nabla u|^{P(x,|\nabla u|)} dx \quad (4)$$

where P can either be a constant, P≡1 or P≡2, or where P can be a function, $$P(x, |\nabla u|) = \begin{cases} 1 + g(x) = 1 + \dfrac{1}{1+\beta|\nabla G_\sigma * u_0|^2}, & |\nabla \lambda_D| = 0 \\ 2, & |\nabla \lambda_D| > 0 \end{cases} \quad (5)$$

where β, σ are parameters.

The parameter β is used to accentuate the edges between regions of different intensities, larger β will better preserve edges. The parameters is for the Gaussian function, $G_\sigma = \exp(-|x|^2/(4\sigma^2))/\sigma$, which is used to smooth the image by the standard method of weighted averages. At areas of fairly uniform intensity, $|\nabla u|$ is small, causing P(x) to be large. Hence the diffusion is more isotropic. At edges between regions with very different intensities, $|\nabla u|$ is large so that P(x) will be close to 1; anisotropic diffusion is then applied so that the edges will be preserved. For the edges between D and Ω\D, $|\nabla \lambda_D|$ is larger than 0, hence P(x) will be set to 2 and image will be isotropically extended. Therefore the goal of choosing P(x) is to control the type of diffusion at specific locations in the image, so that isotropic and anisotropic diffusion are effectively combined (with little threshold sensitivity). Specifically, total variation diffusion is used to preserve edges and create varying combinations of isotropic and anisotropic diffusion in regions that may or may not contain significant features.

The Modified TV Model for Sensitivity Maps

In order to apply the model to sensitivity maps, the conventional model may be modified based on the particular application. There will be a sensitivity map $u_j$ for each coil j. Let $I_j$ be the image generated by coil j, and let I be the homogeneous image, then $u_j^0$ is defined as $I_j/I$. In order to avoid singularities and to consider every coil, $$\int_\Omega \lambda_D(x)(u-u^0)^2 dx \text{ should be replaced by} \quad (6)$$

$$\sum_j \int_\Omega \lambda_{D_j}(x)(u_j I - I_j)^2 dx$$

If the square root of the sum of squares of the $I_j$s is used as the homogeneous image I(i.e., sum-of-squares image), then the sum of squares of every coil's sensitivity map will be unity at each pixel. Therefore $$\int_\Omega \left(\sqrt{\sum_j u_j^2} - 1\right)^2 dx \quad (7)$$

is to be minimized, where $u_j$ is the inpainted sensitivity map for the $j^{th}$ probe coil. Then the modified TV model for the sensitivity map is, $$E[u_j|u_j^0, D] = \frac{1}{2} \sum_j \int_\Omega \lambda_{D_j}(x)(u_j I - I_j)^2 dx + \quad (8)$$

-continued $$\gamma \sum_j \int_\Omega |\nabla u_j|^{P(x,|\nabla u_j|)} dx + \frac{\mu}{2} \int_\Omega \left( \sqrt{\sum_j u_j^2} - 1 \right)^2 dx$$

where $\gamma, \mu$ are used to balance the terms in energy functional. Increasing $\gamma$ in Eq. 8 will result in a smoother image. Larger $\mu$ makes the square root of the sum-of-squares of the sensitivity maps closer to unity.

The Numerical Implementation Method

The Euler-Lagrange equation for Eq. 8 is $$\lambda_{D_j}(x)(u_j I - I_j)I - \gamma \nabla \cdot (|\nabla u_j|^{P-2} P \nabla u_j) + \mu \left( 1 - \frac{1}{\sqrt{\sum_j \mu_j^2}} \right) u_j = 0 \quad (9)$$

with boundary condition $\partial u_j \overline{n} = 0$, for the $j^{th}$ coil. where $\overline{n}$ is the outward unit normal to the image boundary. To derive the evolution equations corresponding to the Euler-Lagrange equation, the following difference scheme (G. Aubert L V. A variational method in image recovery. *SIAM J Numer Anal* 1997; 34(5): 1948-1979.) can be applied in order to discretize Eq. 9. Let u be an image, then define $$\Delta_-^x u_{k,l} = u_{k,l} - u_{k-1,l}, \Delta_+^x u_{k,l} = u_{k+1,l} - u_{k,l}$$

$$\Delta_-^y u_{k,l} = u_{k,l} - u_{k-1,l}, \Delta_+^y u_{k,l} = u_{k+1,l} - u_{k,l}$$

and then $$\Delta u_{k,l} = (\Delta_+^x u_{k,l}, \Delta_+^y u_{k,l})$$

where k, l correspond to rows and columns of the image respectively.

Let $\overline{v} = (v_1, v_2)$ be a vector field and let h be the step space for this field (generally equal to unity), then according to (G. Aubert L V. A variational method in image recovery. *SIAM JNumer Anal* 1997; 34(5): 1948-1979.)

$$div(\overline{v}) = \frac{\Delta^x v_1 + \Delta^y v_2}{h},$$

Applying the difference scheme above, the iteration formula for Eq. 9 is found to be, $$u_j^{n+1} = \frac{\gamma [C_1 u_{k+1,l}^{n,j} + C_2 u_{k-1,l}^{n,j} + C_3 u_{k,l+1}^{n,j} + C_4 u_{k,l-1}^{n,j}] + \lambda_{D_j} I_j I}{\lambda_{D_j} I^2 + \gamma(C_1 + C_2 + C_3 + C_4) + \mu \left( 1 - \frac{1}{\sqrt{\sum_j u_j^2}} \right)} \quad (10)$$

where $$C_1 = \frac{p_{k,l}}{a_{k,l}}, C_2 = \frac{p_{k-1,l}}{a_{k-1,l}}, C_3 = \frac{p_{k,l}}{b_{k,l}}, C_4 = \frac{p_{k,l-1}}{b_{k,l-1}}$$

-continued $$a_{k,l} = \left( (\Delta_+^x u_{k,l}^n)^2 + \left( \frac{u_{k,l+1}^n - u_{k,l-1}^n}{2} \right)^2 \right)^{\frac{2-p_{k,l}}{2}}$$

$$b_{k,l} = \left( (\Delta_+^x u_{k,l}^n)^2 + \left( \frac{u_{k+1,l}^n - u_{k-1,l}^n}{2} \right)^2 \right)^{\frac{2-p_{k,l}}{2}}$$

with j corresponding to the $j^{th}$ coil, k, l corresponding to rows and columns of the image respectively, and n corresponding to the $n^{th}$ iteration.

Pixels in I (the sum-of-squares image) with intensity below some particular threshold will be treated as holes, i.e., belonging to D. This threshold can be automatically determined in several ways. One simple approach is finding the maximum pixel intensity in the entire image and setting the threshold to be 0.05 times this value [i.e., 0.05×(maximum intensity)].

A good initial guess for $u_j$ can reduce the number of iterations involved in applying Eq. 10. Raw sensitivity maps for each coil, defined as $$u_{j\_raw}(x) = \begin{cases} \frac{I_j(x)}{I(x)}, & x \notin D \\ \text{guess}, & x \in D \end{cases}$$

are used as the initial guess for $u_j$. In a specific embodiment, the magnitude of guess is the average intensity of $I_j$, the phase of guess is taken to equal the phase of $I_j$. Another issue associated with sensitivity maps is the fact that they contain complex data. In a specific embodiment, the vector map is inpainted directly. In another specific embodiment, the magnitude and phase part are inpainted separately. Our experiments show no explicit improvement through the use of inpainted phase maps. Accordingly, in another specific embodiment, inpainting is applied only to the magnitude of the sensitivity map, and the phase of $I_j$ is used for $u_j$.

EXAMPLE 1

An embodiment of the subject invention incorporating the inpainting model utilizing Eq.8 was applied as sensitivity map correction. The corrected sensitivity maps were then used by SENSE in the reconstruction of MR images. The accuracy and efficiency of a conventional inpainting technique can be seen in (Tony F Chan J S, Luminita Vese. Variational PDE models in image processing. *Amer Math Soc Notice* 2003; 50: 14-26; Tony F Chan J S. Mathematical model for local non-texture inpaintings. *SIAM J Appl Math* 2001; 62(3): 1019-1043; V. Caselles J-MM, and C. Sbert. An axiomatic approach to image interpolation. *IEEE Trans Image Processing* 1998; 7(3): 376-386). To show the accuracy of the subject modified model for sensitivity map, we first apply the subject method to a phantom without holes. Some holes were randomly chosen and inpainted. The results were then compared with the original sensitivity map that has no holes. Since the actual sensitivity map is not known in real applications, we were unable to determine directly if an inpainted sensitivity map was good or not. Therefore we applied the inpainted sensitivity maps to reconstruct an MR image and then compare the reconstructed image with the reference image (which is generated by using all of K-space as opposed to SENSE which only utilizes part of the K-space data). Let the phrase "intensity difference" refers to the difference in magnitudes between the reconstructed and reference-images at each pixel. We define the "ghost ratio" as the magnitude of the "intensity difference" (at each pixel) summed over every pixel in the image divided by the sum of the absolute values of each pixel in the reference image. The "ghost ratio" is actually the relative error. Notice that the intensity of reconstructed image by SENSE will be lower than reference image because of the lower energy in K-space. According to Parseval's equation, the intensity of all reconstructed image were calibrated by multiplying reduce factor when calculate the "intensity difference" in all experiments.

An alternative way to fix holes is to apply Gaussian kernel smoothing (L. Rudin S O, and E. Fatemi. Nonlinear total variation based noise removal algorithms. *Physica D* 1992; 60: 259-268). For the sake of comparison with the subject method, which can be considered a modified TV model), sensitivity maps corrected by Gaussian kernel smoothing (GKS) and raw sensitivity maps are also applied to SENSE.

In many real applications, a low-resolution image is used to produce a sensitivity map. According to (Charles A. McKenzie E N Y, Michael A. Ohliger, Mark D. Price, and Daniel K. Sodickson. Self-Calibrating Parallel Imaging with Automatic Coil Sensitivity Extraction. *Magnetic Resonance in Medicine* 2002; 47: 529-538), it is possible to extract the sensitivity map directly from a fully sampled central band of K-space . (The center of the band being the center of K-space, with the band extending along the complete width in the frequency encode direction, but leaving out the top and bottom sections of the K-space.) Since the acquisition of the sensitivity map data and the data to be reconstructed occurs simultaneously, errors due to sensitivity mis-calibration are eliminated. An alternative method for acquiring the sensitivity map for dynamic magnetic resonance (MR) (such as a cardiac series) is to apply one high-resolution sensitivity map (i.e., utilizing the entire K-space) for a complete time sequence. Both methods are tested in this example to show the flexibility of the inpainting technique.

The choice of parameters may depend on the system and loading. According to experiments, the model is not very sensitive to the choice of parameters. In this example, we set $\beta=1, \sigma=0.25, \gamma=10$ and $\mu=1$.

In all of the experiments described in this example, MATLAB codes are run on a COMPAQ PC with a IG Hz CPU and IG RAM.

Phantom with No Intrinsic Holes

A phantom was constructed from a 197 mm (7.75") ID by a 180 mm long acrylic tube that was filled with a solution of $Cu_2SO_4$ (2.0 grams/Liter) and NaCl (4.5 grams/Liter). FIG. 1A shows a photo of this phantom. Data was then collected by a 1.5 T SIEMENS system (FOV 300 mm, matrix 1 28×128, TR 300 ms, TE 15 ms, flip angle 90°, slice thickness 5 mm, number of averages 1) with an 8-channel tuned loop array of coils. The time required for the calculation of 8 sensitivity maps was 4.35 seconds.

Figure 1C:
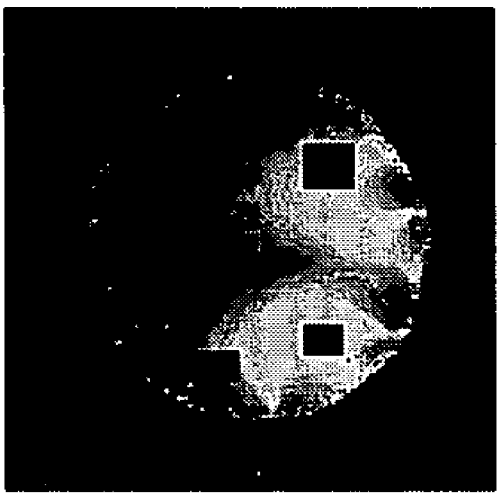
Figure 1D:
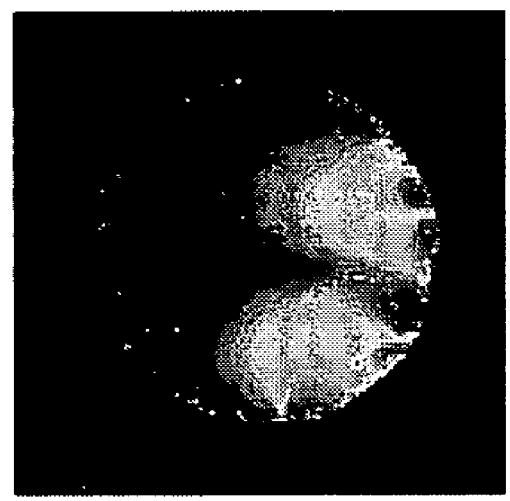

If we ignore the container there are no holes at all in the original sensitivity map. FIG. 1 B shows the magnitude of the original sensitivity map of coil 1. Five holes were then randomly made in the original sensitivity map. FIG. 1C shows these holes. FIG. 1D shows the inpainted result for coil 1. The local patterns are perfectly preserved in the inpainted result. We define the "relative error" as the sum over the absolute value of the difference between the inpainted result and the original sensitivity, for each pixel in the map over the sum of the magnitudes of the original sensitivity map. Table 1 shows the relative error of each channel. The average relative error of all 8 channels using the subject modified TV method is 0.71%. The average relative error using GKS is 4.45%.

TABLE 1

The relative error of inpainted results

| coil | Relative error by inpainting | Relative error by GKS |
|---|---|---|
| 1 | 0.49% | 3.52% |
| 2 | 0.40% | 4.45% |
| 3 | 1.84% | 7.57% |
| 4 | 0.70% | 4.87% |
| 5 | 0.46% | 3.44% |
| 6 | 0.29% | 2.61% |
| 7 | 1.08% | 4.12% |
| 8 | 0.44% | 4.97% |
| average | 0.71% | 4.45% |

EXAMPLE 2

Coronal Phantom

FIGS. 2A-2H and Table 2 show results for a Coronal Phantom collected by a 1.5 T GE system (FOV 480 mm, matrix 256×256, TR 500 ms, TE 13.64 ms, flip angle 90°, slice thickness 3 mm, number of averages 1) with an 8-channel Neurovascular Array coil. The time required for the calculation of 8 sensitivity maps was 16.1 1 seconds.

TABLE 2

Ghost Ratio of Coronal Phantom

|  | R_factor = 2 | R_factor = 3 | R_factor = 4 |
|---|---|---|---|
| Inpainted high resolution | 1.06% | 3.12% | 2.24% |
| Raw high resolution | 6.07% | 7.41% | 6.41% |
| GKS high resolution | 2.18% | 4.48% | 4.76% |
| Inpainted low resolution | 2.03% | 4% | 4.6% |
| Raw low resolution | 6.7% | 7.96% | 7.26% |
| GKS low resolution | 2.20% | 4.48% | 4.72% |

In this example, high-resolution sensitivity maps are generated by using images reconstructed utilizing the full K-space for each coil. Low-resolution sensitivity maps are generated by using images reconstructed with the 31 central rows of fully sampled data. Low-resolution sensitivity maps are more likely to be used in real applications.

Figure 2A:
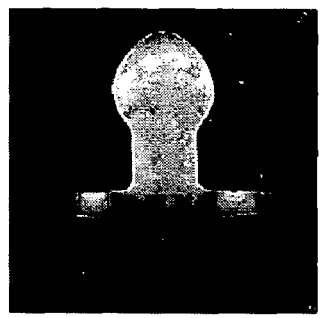
FIGS. 2A-2H show results in accordance with the subject invention for a Coronal Phantom, where
Figure 2B:
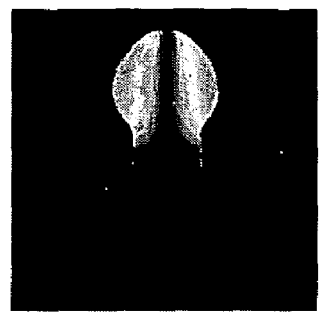
Figure 2C:
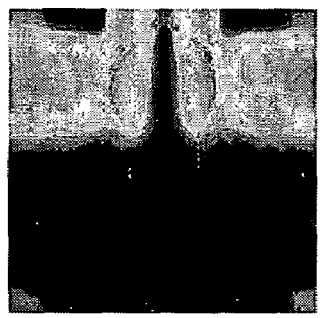
Figure 2D:
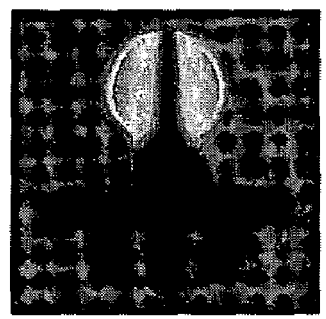
Figure 2E:
Figure 2F:
Figure 2G:
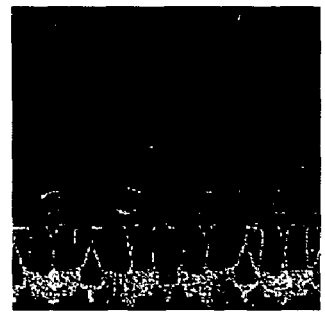
Figure 2H:
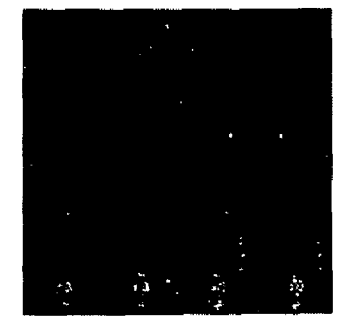

FIG. 2A is the reference image that is reconstructed utilizing the full K-space. FIGS. 2B-2D show the magnitude of the sensitivity map of coil 6. FIG. 2B shows the magnitude of the raw sensitivity map. FIG. 2C shows the result of inpainting applied to the raw sensitivity map 2-b, while FIG. 2D shows 2-d is the result of applying GKS to the raw sensitivity map. From FIG. 2C, it can be seen that the inpainted sensitivity maps have no holes and thus extend the map to the entire image. Furthermore, in FIG. 2C, the local patterns are perfectly preserved. FIGS. 2E-2H show the intensity difference between images reconstructed by SENSE with a K-space reduction factor of 4 (i.e., using 25% of the full K-space data) and the reference image, these images use the same gray scale map. FIG. 2E shows this intensity difference when the reconstruction is done using high-resolution inpainted sensitivity maps. FIG. 2F shows this intensity difference when the reconstruction is done using high-resolution raw sensitivity maps, while FIG. 2G shows this intensity difference for GKS corrected sensitivity maps. From FIGS. 2E-2G, it is seen that the result obtained by using inpainted sensitivity maps is much better than that obtained by using either the raw sensitivity maps or the GKS sensitivity maps. FIG. 2H shows the intensity difference obtained using low-resolution inpainted sensitivity maps. FIG. 2H also shows that even in this case the result is still better than that obtained by the use of high-resolution GKS sensitivity maps.

Table 1 gives the ghost ratios obtained through the use of difference sensitivity maps. The term, R-factor, refers to the reduction factor of K-space. It can be seen that the results obtained by using the inpainted sensitivity maps have much lower ghost ratios for each reduction factor than the results obtained by using raw sensitivity maps. Notice that the results obtained from the high-resolution GKS sensitivity maps are very similar to those obtained from the low-resolution GKS sensitivity maps. The reason for this is that the GKS correction involves an isotropically smooth blurring of the image, which is very similar to the isotropic blurring which results due to an image being low resolution. An image reconstructed through the use of a fully sampled central region of K-space also results in an isotropically smoothed version of the reference image, since this is also a low-resolution image. This is true since any point in K-space is a superposition of signals from each point in the slice. For a uniform phantom, these two maps (a low-resolution GKS map and a high-resolution GKS map) may generate similar results. For the same reason that low resolution results in an isotropic smoothing, the images from inpainted low-resolution sensitivity maps are similar to those resulting from GKS sensitivity maps.

EXAMPLE 3

Neurovascular Images

TABLE 1

The relative error of inpainted results

| coil | Relative error by inpainting | Relative error by GKS |
|---|---|---|
| 1 | 0.49% | 3.52% |
| 2 | 0.40% | 4.45% |
| 3 | 1.84% | 7.57% |
| 4 | 0.70% | 4.87% |
| 5 | 0.46% | 3.44% |
| 6 | 0.29% | 2.61% |
| 7 | 1.08% | 4.12% |
| 8 | 0.44% | 4.97% |
| average | 0.71% | 4.45% |

Both FIG. 3 and Table 3 show the results for Neurovascular Images collected by a 1.5 T GE system (FOV 440 mm, matrix 256×192, TR 1000 ms, TE 13.504 ms, flip angle 90°, slice thickness 2 mm, number of averages 2) through the use of a fast spin echo pulse sequence with an 8-channel Neurovascular Array coil. The time required for the calculation of 8 sensitivity maps was 15.01 seconds.

TABLE 2

Ghost Ratio of Coronal Phantom

|  | R_factor = 2 | R_factor = 3 | R_factor = 4 |
|---|---|---|---|
| Inpainted high resolution | 1.06% | 3.12% | 2.24% |
| Raw high resolution | 6.07% | 7.41% | 6.41% |
| GKS high resolution | 2.18% | 4.48% | 4.76% |
| Inpainted low resolution | 2.03% | 4% | 4.6% |
| Raw low resolution | 6.7% | 7.96% | 7.26% |
| GKS low resolution | 2.20% | 4.48% | 4.72% |

TABLE 3

Ghost Ratio of Neurovascular Images

|  | R_factor = 2 | R_factor = 3 | R_factor = 4 |
|---|---|---|---|
| Inpainted high resolution | 4.21% | 5.14% | 6.82% |
| Raw high resolution | 13.75% | 14.40% | 15.62% |
| GKS high resolution | 5.91% | 7.74% | 11.28% |
| Inpainted low resolution | 6.61% | 8.36% | 10.57% |
| Raw low resolution | 15.07% | 15.49% | 17.10% |
| GKS low resolution | 8.81% | 9.7% | 12.76% |

The contents of FIG. 3 and Table 3 are similar to that of FIG. 2 and Table 2. The reduce-factor for FIGS. 3E-3H is also 4. Table 2 again shows that the results obtained by using inpainted sensitivity maps have much lower ghost ratios for each reduction factor.

For FIG. 3H, the low-resolution sensitivity maps are generated by using images reconstructed with the 31 central rows of fully sampled K-space data.

EXAMPLE 4

Cardiac Images

Table 4 and Table 5 show the results for Cardiac Images collected by a 1.5 T GE system (FOV 240 mm, matrix 224×192, TR 4.530 ms, TE 1.704 ms, flip angle 45°, slice thickness 5 mm, number of averages 2) through Fast Imaging Employing Steady-State Acquisition (FIESTA) with a GE 4-channel cardiac coil. Breath-holds ranged from 10-20 seconds. There are 20 images per heartbeat. High-resolution sensitivity maps (for each coil) were obtained from the first image in this sequence through the use of the full K-space. SENSE was then applied to each image in the sequence including the first by using the same sensitivity maps.

TABLE 4

Ghost Ratio of Cardiac Images by applying high-resolution sensitivity maps of first image.

| Image | Inpainted | raw | GKS |
|---|---|---|---|
| 1 | 2.19% | 9.18% | 2.98% |
| 2 | 11.69% | 16.50% | 12.04% |
| 3 | 15.32% | 19.43% | 16.42% |
| 4 | 16.10% | 20.22% | 17.10% |
| 5 | 15.92% | 19.98% | 16.68% |
| 6 | 15.70% | 19.53% | 16.76% |
| 7 | 15.59% | 19.40% | 16.58% |
| 8 | 15.39% | 19.36% | 16.20% |
| 9 | 15.38% | 19.26% | 16.35% |
| 10 | 15.57% | 19.43% | 16.60% |
| 11 | 15.53% | 19.42% | 16.28% |
| 12 | 15.33% | 19.23% | 16.34% |
| 13 | 15.23% | 19.14% | 16.14% |
| 14 | 15.04% | 18.98% | 15.80% |
| 15 | 15.07% | 18.92% | 16.06% |
| 16 | 15.08% | 18.95% | 15.95% |
| 17 | 15.19% | 19.17% | 15.98% |
| 18 | 15.45% | 19.46% | 16.47% |
| 19 | 14.93% | 19.06% | 15.65% |
| 20 | 11.83% | 16.48% | 12.47% |
| average | 14.38% | 18.55% | 15.24% |

TABLE 5

Ghost Ratio of Cardiac Images by applying
low-resolution sensitivity maps of each image.

| Image | Inpainted | raw | GKS |
|---|---|---|---|
| 1 | 10.64% | 17.85% | 11.96% |
| 2 | 11.29% | 18.57% | 12.25% |
| 3 | 11.08% | 18.34% | 12.64% |
| 4 | 11.16% | 18.27% | 12.58% |
| 5 | 11.04% | 17.99% | 11.93% |
| 6 | 10.62% | 17.59% | 12.00% |
| 7 | 10.45% | 17.23% | 11.66% |
| 8 | 10.56% | 17.18% | 11.31% |
| 9 | 10.28% | 17.00% | 11.23% |
| 10 | 10.42% | 17.26% | 11.62% |
| 11 | 10.45% | 17.25% | 11.17% |
| 12 | 10.37% | 17.17% | 11.53% |
| 13 | 10.26% | 17.09% | 11.37% |
| 14 | 10.26% | 17.13% | 10.97% |
| 15 | 10.19% | 17.26% | 11.42% |
| 16 | 10.11% | 17.18% | 11.00% |
| 17 | 10.24% | 17.34% | 11.19% |
| 18 | 10.63% | 17.74% | 12.06% |
| 19 | 10.81% | 17.85% | 11.59% |
| 20 | 10.69% | 17.92% | 11.67% |
| average | 10.58% | 17.56% | 11.66% |

Table 4 shows the ghost ratios obtained by applying the high resolution sensitivity maps from the first image reconstruction to all 20 images in the same heartbeat. The R_factor of K-space here is 2. Note the ratios for image 1 are much lower than the others since strictly speaking the sensitivity maps are only correct for this image due to the motion of the heart during the heartbeat. Table 5 shows the results of applying low-resolution sensitivity maps obtained from each image in the series. These are generated from the 51 central rows of fully sampled K-space data (Charles A. McKenzie E N Y, Michael A. Ohliger, Mark D. Price, and Daniel K. Sodickson. Self-Calibrating Parallel Imaging with Automatic Coil Sensitivity Extraction. *Magnetic Resonance in Medicine* 2002; 47: 529-538). The reduction factor of K-space is in this case is only 1.6232. The non-integer value is due to rows being skipped only outside the 51 row central band. Table 4 and 5 show that inpainted sensitivity maps are more accurate than both the raw sensitivity maps and GKS sensitivity maps for dynamic image.

All patents, patent applications, provisional applications, and publications referred to or cited herein are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application.

REFERENCES

1. C. Ballester M B, V. Caselles, G. Sapiro, and J. Verdera. Filling-in by joint interpolation of vector fields and grey levels. IEEE Trans Image Process 2001; 10(8): 1200-1211.
2. Tony F Chan J S, Luminita Vese. Variational PDE models in image processing. Amer Math Soc Notice 2003; 50: 14-26.
3. Tony F Chan J S. Mathematical model for local non-texture inpaintings. SIAM J Appl Math 2001; 62(3): 1019-1043.
4. Shen TFCaJ. Non-texture inpainting by curvature driven diffusions. J Visual Comm Image Rep 2001; 12(4): 436-449.
5. V. Caselles J-M M, and C. Sbert. An axiomatic approach to image interpolation. IEEE Trans Image Processing 1998; 7(3): 376-386.
6. Sodickson D. Spatial Encoding Using Multiple RF Coils: SMASH Imaging and Parallel MRI. I Y, editor: John Wiley & Sons Ltd; 2000.
7. Pruessmann K P W M, Scheidegger M B, Boesiger P. Coil sensitivity encoding for fast MRI. 1998; Sixth Scientific Meeting of ISMRM, Sydney, Australia. P. 579.
8. Pruessmann K P W M, Scheidegger M B, Boesiger P. SENSE: Sensivity encoding for fast MRI. Magn Reson Med 1999; 42: 952-962.
9. Miguel Angel Gonzalez Ballester Y M, Yoshimori Kassai, Yoshinori Hamamura, Hiroshi Sugimoto, Robust Estimation of Coil Sensitivities for RF Subencoding Acquisition Techniques. 2001. p 799.
10. F. H. Lin Y-JC, and J. W. Belliveau, L. L. Wald. Estimation of coil sensivity map and correction of surface coil magnetic resonance images using wavelet decomposition. 2001; Brighton, UK.
11. M. S. Cohen R M D, and M. M. Zeineh. Rapid and effective correction of RF inhomogeneity for high field magnetic resonance imaging. Hum Brain Mapp 2000; 10: 204-211.
12. L. Rudin SO, and E. Fatemi. Nonlinear total variation based noise removal algorithms. Physica D 1992; 60: 259-268.
13. G. Aubert L V. A variational method in image recovery. SIAM J Numer Anal 1997; 34(5): 1948-1979.
14. Charles A. McKenzie E N Y, Michael A. Ohliger, Mark D. Price, and Daniel K. Sodickson. Self-Calibrating Parallel Imaging with Automatic Coil Sensitivity Extraction. Magnetic Resonance in Medicine 2002; 47: 529-538.
15. M. Bertalmio, G. Sapiro, C. Ballester, and V. Caselles, "Image impainting," presented at Computer Graphics, SIGGRAPH, 2000.

We claim:
1. A method for producing sensitivity maps, comprising:
   receiving an original plurality of sensitivity maps $u_j^o$ corresponding to a plurality of coils in an imaging system, where $u_j^o$ corresponds to the $j^{th}$ coil;
   minimizing an energy functional, where the energy functional $E[u_j|u_j^o, D]$ is given by

$$E[u_j|u_j^0, D] = \frac{1}{2}\sum_j \int_\Omega \lambda_{D_j}(x)(u_j I - I_j)^2 dx +$$

$$\gamma \sum_j \int_\Omega |\nabla u_j|^{P(x,|\nabla u_j|)} dx + \frac{\mu}{2} \int_\Omega \left(\sqrt{\sum_j u_j^2} - 1\right)^2 dx$$

wherein $u_j$ is an inpainted sensitivity map for the $J^{th}$ coil and D is the dark regions of $u_j^o$ where $$\sum_j \int_\Omega \lambda_{D_j}(x)(u_j I - I_j)^2 dx$$

is where is the fidelity term, $$\sum_j \int_\Omega |\nabla u_j|^{P(x,|\nabla u_j|)} dx$$

is the smoothing term, and $$\int_\Omega \left( \sqrt{\sum_j u_j^2} - 1 \right)^2 dx$$

is the sum of squares of the sensitivity maps;
where $u_j^o$ is the image generated by coil j, wherein $u_j^o$ is defined as $I_j/I$, where $I_j$ is the image generated by coil j and the homogeneous image, I, is the square root of the sum of squares of $I_j$,
where γ and μ balance the terms in the energy functional, wherein increasing γ results in a smoother image, wherein maximizing μ brings the term $$\int_\Omega \left( \sqrt{\sum_j u_j^2} - 1 \right)^2 dx$$

closer to unity,
applying $\bar{v}=(v_1, v_2)$ is a vector field and h is the step space for this field $$div(\bar{v}) = \frac{\Delta_-^x v_1 + \Delta_-^y v_2}{h},$$

where the Euler-Lagrange equation for the energy functional, where the Euler-Lagrange equation for the energy functional is $$\lambda_{D_j}(x)(u_j I - I_j)I - \gamma \nabla \cdot (|\nabla u_j|^{P-2} P \nabla u_j) + \mu \left( 1 - \frac{1}{\sqrt{\sum_j \mu_j^2}} \right) u_j = 0$$

with boundary condition $\partial u_j / \partial \bar{n}=0$, for the $j^{th}$ coil, where $\bar{n}$ is the outward unit normal to the image boundary, to produce an iteration formula corresponding to the Euler-Lagrange equation for the energy function, wherein the iteration formula is $$u_j^{n+1} = \frac{\gamma[C_1 u_{k+1,l}^{n,j} + C_2 u_{k-1,l}^{n,j} + C_3 u_{k,l+1}^{n,j} + C_4 u_{k,l-1}^{n,j}] + \lambda_{D_j} I_j I}{\lambda_{D_j} I^2 + \gamma(C_1 + C_2 + C_3 + C_4) + \mu \left( 1 - \frac{1}{\sqrt{\sum_j u_j^2}} \right)}$$

where $$C_1 = \frac{p_{kl}}{a_{kl}}, \; C_2 = \frac{p_{k-1,l}}{a_{k-1,l}}, \; C_3 = \frac{p_{kl}}{b_{kl}}, \; C_4 = \frac{p_{k,l-1}}{b_{k,l-1}}$$

$$a_{kl} = \left( (\Delta_+^x u_{kl}^n)^2 + \left( \frac{u_{k,l+1}^n - u_{k,l-1}^n}{2} \right)^2 \right)^{\frac{2-p_{kl}}{2}}$$

$$b_{kl} = \left( (\Delta_+^x u_{kl}^n)^2 + \left( \frac{u_{k+1,l}^n - u_{k-1,l}^n}{2} \right)^2 \right)^{\frac{2-p_{kl}}{2}}$$

where j corresponds to the $j^{th}$ coil, k,l correspond to rows and columns of the image u respectively, and n corresponds to the $n^{th}$ iteration;
providing an initial guess for $u_j$, wherein the initial guess for $u_j$ comprises the raw sensitivity maps for each coil:

$$u_j\_raw(x) = \begin{cases} \frac{I_j(x)}{I(x)}, & x \notin D \\ \text{guess}, & x \in D; \end{cases}$$

and
iterating the iteration formula to minimize the energy functional.

* * * * *

UNITED STATES PATENT AND TRADEMARK OFFICE
CERTIFICATE OF CORRECTION

PATENT NO. : 7,230,429 B1
APPLICATION NO. : 11/041904
DATED : June 12, 2007
INVENTOR(S) : Feng Huang, Randy Duensing and Yunmei Chen It is certified that error appears in the above-identified patent and that said Letters Patent is hereby corrected as shown below:

Column 1,
Line 24, "Pruessmann K P W M, Scheidegger M B," should read
 --Pruessman, K. P., Weiger, M., Scheidegger M. B.,--.
Lines 26-27, "Miguel Angel Gonzalez Ballester Y M" should read
 --Miguel Angel Gonzalez, Ballester, Yoshio Machida--.
Lines 30-31, "F. H. Lin Y-JC, and J.W. Belliveau, L.L. Wald" should read
 --F. H. Lin, L.L. Wald, Y-J Chen, and J.W. Belliveau--.
Line 34, "M. S. Cohen R M D," should read --M. S. Cohen, R. M. DuBois,--.
Line 38, "G. Aubert L V" should read
 --G. Aubert and L. Vese--.
Lines 39-40, "Shen TFCaJ," should read
 --Chan, Tony F. and Shen, Jianhong--.
Line 42, "Tony F Chan J S" should read --Tony F. Chan, Jianhong Shen--.
Line 44, "Tony F Chan J S" should read --Tony F, Chan and Jianhong Shen--.
Line 46, "V. Caselles J-MM," should read --V. Caselles, J-M. Morel,--.
Lines 49-50, "Pruessmann K P W M, Scheidegger M B," should read
 --Pruessmann, K. P., Weiger, M., Scheideger M. B.,--.
Lines 51-52, "Miguel Angel Gonzalez Ballester Y M" should read
 --Miguel Angel Gonzalez Ballester, Yoshio Machida--.
Line 55, "F. H. Lin Y-JC, and J.W. Belliveau, L.L. Wald" should read
 --F. H. Lin, L.L. Wald, Y-J. Chen, and J.W. Belliveau--.
Line 58, "M. S. Cohen R M D," should read --M. S. Cohen, R. M. DuBois--.

Column 2,
Line 9, "(C. Ballester M B," should read --(C. Ballester, M. Bertalmio,--.
Line 12, "Tony F Chan J S," should read --Tony F. Chan, Jianhong Shen,--.
Line 14, "Tony F Chan J S" should read --Tony F. Chan and Jianhong Shen--.
Line 16, "Shen TFCaJ." should read --Chan, Tony F. and Shen, Jianhong.--.
Line 18, "V. Caselles J-MM," should read --V.Caselles, J-M. Morel--.
Lines 29-30, "Tony F Chan J S" should read --Tony F. Chan, Jianhong Shen--.
Line 46, "Pruessmann K P W M, Scheidegger M B," should read
 --Pruessmann, K. P., Weiger, M., Scheidegger M. B.,--.
Lines 48-49, "Pruessmann K P W M, Scheidegger M B," should read
 --Pruessmann, K. P., Weiger, M., Scheidegger M. B.,--
Lines 66-67, "Miguel Angel Gonzalez Ballester Y M" should read
 --Miguel Angel Gonzalez Ballester, Yoshio Machida--.

Column 3,
Line 3, "F. H. Lin Y-JC, and J.W. Belliveau, L.L. Wald" should read
 --F. H. Lin, L.L. Wald, Y-J. Chen, and J.W. Belliveau--.
Line 7, "(M. S. Cohen R M D," should read --(M. S. Cohen, R. M. DuBois,--.

UNITED STATES PATENT AND TRADEMARK OFFICE
CERTIFICATE OF CORRECTION

PATENT NO. : 7,230,429 B1
APPLICATION NO. : 11/041904
DATED : June 12, 2007
INVENTOR(S) : Feng Huang, Randy Duensing and Yunmei Chen It is certified that error appears in the above-identified patent and that said Letters Patent is hereby corrected as shown below:

Column 4,
Line 53, "And The G-convergence" should read --And the G-convergence--.
Line 57, "$E_\varepsilon[u,z]$" should read --$E_s[u,z]$--.
Line 64, "In specific embodiment" should read --In a specific embodiment--.

Column 6,
Lines 31-32, "Pruessmann K P W M, Scheidegger M B," should read
--Pruessmann, K. P., Weiger, M., Scheidegger M. B.,--.

Column 7,
Line 15, " $\int^\Omega \lambda_D(x)(u-u^0)^2 dx$ " should read -- $\int_\Omega \lambda_D(x)(u-u^0)^2 dx$ --.

Line 21, "Tony F Chan J S." should read --Tony F. Chan and Jianhong Shen.--
Line 23, "L. Rudin S O" should read --L. Rudin, S. Osher--.
Line 43, "L. Rudin S O" should read --L. Rudin, S. Osher--.
Line 45, " $\int_{106} |\nabla u| dx$ " should read -- $\int_\Omega |\nabla u| dx$ --.

Line 66, " $\int_{106} |\nabla u|$ " should read -- $\int_\Omega |\nabla u|$ --.

Column 9,
Line 23, " $\partial u_j \bar{n} = 0$ " should read -- $\partial u_j / \partial \bar{n} = 0$ --.

Line 26, "G. Aubert L V" should read --G. Aubert and L. Vese--.
Line 32, " $\Delta^x_- u_{kl} = u_{kl} - u_{k-1,l}, \Delta^x_+ u_{kl} = u_{k+1,l} - u_{k,l}$ " should read $$\Delta^y_- u_{kl} = u_{kl} - u_{k,l-1}, \Delta^y_+ u_{kl} = u_{k+1,l} - u_{k,l}$$

-- $\Delta^x_- u_{kl} = u_{kl} - u_{k-1,l}, \Delta^x_+ u_{kl} = u_{k+1,l} - u_{k,l}$ --.

$$\Delta^y_- u_{kl} = u_{kl} - u_{k,l-1}, \Delta^y_+ u_{kl} = u_{k,l+1} - u_{k,l}$$

Line 43, "G. Aubert L V" should read --G. Aubert and L. Vese--.

UNITED STATES PATENT AND TRADEMARK OFFICE
CERTIFICATE OF CORRECTION

PATENT NO. : 7,230,429 B1
APPLICATION NO. : 11/041904
DATED : June 12, 2007
INVENTOR(S) : Feng Huang, Randy Duensing and Yunmei Chen It is certified that error appears in the above-identified patent and that said Letters Patent is hereby corrected as shown below:

Line 56, "
$$u_j^{n+1} = \frac{\gamma\left[C_1 u_{k+1,l}^{n,j} + C_2 u_{k-1,l}^{n,j} + C_3 u_{k,l+1}^{n,j} + C_4 u_{k,l-1}^{n,j}\right] + \lambda_{D_j} I_j I}{\lambda_{D_i} I^2 + \gamma\left(C_1 + C_2 + C_3 + C_4\right) + \mu\left(1 - \frac{1}{\sqrt{\sum_j u_j^2}}\right)}$$
"

should read $$-- \quad u_j^{n+1} = \frac{\gamma\left[C_1 u_{k+1,l}^{n,j} + C_2 u_{k-1,l}^{n,j} + C_3 u_{k,l+1}^{n,j} + C_4 u_{k,l-1}^{n,j}\right] + \lambda_{D_j} I_j I}{\lambda_{D_j} I^2 + \gamma\left(C_1 + C_2 + C_3 + C_4\right) + \mu\left(1 - \frac{1}{\sqrt{\sum_j u_j^2}}\right)} \quad --.$$

Column 10,
Line 50, "Tony F Chan J S" should read --Tony F.Chan, Jianhong Shen--.
Line 52, "Tony F Chan J S" should read --Tony F. Chan and Jianhong Shen--.
Line 55, "V. Caselles J-MM," should read --V. Caselles, J-M. Morel--.

Column 11,
Line 1, "refers to the difference" should read --refer to the difference--.
Line 9, "reconstructed image" should read --reconstructed images--.
Line 10, "when calculate" should read --when calculating--.
Line 13, "L. Rudin S O" should read --L. Rudin, S. Osher--.
Line 21, "McKenzie E N Y" should read --McKenzie, Ernest N. Yeh--.
Lines 49-50, "matrix 1 28x128" should read --matrix 128x128--.

Column 12,
Line 26, "16.1 1 seconds" should read --16.11 seconds--.

Column 15,
Line 39, "McKenzie E N Y" should read --McKenzie, Ernest N. Yeh--.
Line 42, "529-538)._The reduction" should read --529-538.) The reduction--.
Line 61, "(C. Ballester M B," should read --(C. Ballester, M. Bertalmio,--
Line 65, "Tony F Chan J S" should read --Tony F. Chan, Jianhong Shen--.

UNITED STATES PATENT AND TRADEMARK OFFICE
CERTIFICATE OF CORRECTION

PATENT NO. : 7,230,429 B1
APPLICATION NO. : 11/041904
DATED : June 12, 2007
INVENTOR(S) : Feng Huang, Randy Duensing and Yunmei Chen It is certified that error appears in the above-identified patent and that said Letters Patent is hereby corrected as shown below:

Column 16,
Line 1, "Tony F Chan J S" should read --Tony F. Chan and Jianhong Shen--.
Line 4, "Shen TFCaJ," should read --Chan, Tony F. and Shen, Jianhong--.
Line 7, "V. Caselles J-MM" should read --V. Caselles, J-M. Morel--.
Line 13, "Pruessmann K P W M, Scheidegger M B," should read
    --Pruessmann, K. P., Weiger, M., Scheidegger M. B.,--.
Line 16, "Pruessmann K P W M, Scheidegger M B," should read
    --Pruessmann, K. P., Weiger, M., Scheidegger M. B.,--.
Line 19, "Miguel Angel Gonzalez Ballester Y M" should read
    --Miguel Angel Gonzalez Ballester, Yoshio Machida--.
Line 23, "F. H. Lin Y-JC, and J.W. Belliveau, L.L. Wald" should read
    --F. H. Lin, L.L. Waldo, Y-J. Chen, and J.W. Belliveau--.
Line 27, "M. S. Cohen R M D," should read --M. S. Cohen, R. M. DuBois--.
Line 31, "L. Rudin S O" should read --L. Rudin, S. Osher--.
Line 34, "G. Aubert L V" should read --G. Aubert and L. Vese--.
Line 36, "McKenzie E N Y" should read --McKenzie, Ernest N. Yeh--.

Column 17,
Line 31 " $\overline{v} = (v_1, v_2)$ " should read -- $\vec{v} = (v_1, v_2)$ --.

Line 35, " $div\ (\overline{v})$ " should read -- $div\,(\vec{v})$ --.

Lines 38-40, "where the Euler-Lagrange equation for the energy functional, where the Euler-Lagrange equation for the energy functional" should read
    --where the Euler-Lagrange equation for the energy functional--.
Line 44, " $\lambda_{D_j}(x)(u_j I - I_j)I - \gamma \nabla \cdot (|\nabla u_j|^{p-2} P \nabla u_j) + \mu \left(1 - \frac{1}{\sqrt{\sum_j \mu_j^2}}\right) u_j = 0$ "

should read -- $\lambda_{D_j}(x)(u_j I - I_j)I - \gamma \nabla \cdot (|\nabla u_j|^{p-2} P \nabla u_j) + \mu \left(1 - \frac{1}{\sqrt{\sum_j u_j^2}}\right) u_j = 0$ --.

UNITED STATES PATENT AND TRADEMARK OFFICE
CERTIFICATE OF CORRECTION

PATENT NO.        : 7,230,429 B1
APPLICATION NO.   : 11/041904
DATED             : June 12, 2007
INVENTOR(S)       : Feng Huang, Randy Duensing and Yunmei Chen It is certified that error appears in the above-identified patent and that said Letters Patent is hereby corrected as shown below:

Column 17,
Line 47, " $\partial u_j / \partial \overline{n} = 0$ " should read -- $\partial u_j / \partial \overline{n} = 0$ --.

Signed and Sealed this

Fourteenth Day of October, 2008

JON W. DUDAS
*Director of the United States Patent and Trademark Office*